US011552097B2

(12) United States Patent
Liu et al.

(10) Patent No.: US 11,552,097 B2
(45) Date of Patent: Jan. 10, 2023

(54) METHOD AND STRUCTURE FOR FORMING STAIRS IN THREE-DIMENSIONAL MEMORY DEVICES

(71) Applicant: YANGTZE MEMORY TECHNOLOGIES CO., LTD., Wuhan (CN)

(72) Inventors: Xinxin Liu, Wuhan (CN); Jingjing Geng, Wuhan (CN); Zhu Yang, Wuhan (CN); Chen Zuo, Wuhan (CN); Xiangning Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 16 days.

(21) Appl. No.: 16/727,896

(22) Filed: Dec. 26, 2019

(65) Prior Publication Data
US 2021/0134830 A1 May 6, 2021

Related U.S. Application Data

(63) Continuation of application No. PCT/CN2019/115668, filed on Nov. 5, 2019.

(51) Int. Cl.
*H01L 27/11548* (2017.01)
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC ........... H01L 23/5283; H01L 21/76832; H01L 21/76804; H01L 27/1157; H01L 27/11582
See application file for complete search history.

(56) References Cited

U.S. PATENT DOCUMENTS

| 9,397,115 B1 | 7/2016 | Nozawa |
| 2016/0071877 A1 | 3/2016 | Kim et al. |

(Continued)

FOREIGN PATENT DOCUMENTS

| CN | 107634065 A | 1/2018 |
| CN | 107768377 A | 3/2018 |

(Continued)

OTHER PUBLICATIONS

International Search Report issued in corresponding International Application No. PCT/CN2019/115668, dated Jul. 27, 2020, 5 pages.

*Primary Examiner* — Sarah K Salerno
(74) *Attorney, Agent, or Firm* — Bayes PLLC

(57) ABSTRACT

Embodiments of a three-dimensional (3D) memory device and fabrication methods thereof are disclosed. In an example, a 3D memory device includes a memory stack having a plurality of stairs. Each stair may include interleaved one or more conductor layers and one or more dielectric layers. Each of the stairs includes one of the conductor layers on a top surface of the stair, the one of the conductor layers having (i) a bottom portion in contact with one of the dielectric layers, and (ii) a top portion exposed by the memory stack and in contact with the bottom portion. A lateral dimension of the top portion may be less than a lateral dimension of the bottom portion. An end of the top portion that may be facing away from the memory stack laterally exceeds the bottom portion by a distance.

16 Claims, 12 Drawing Sheets

(56) References Cited

U.S. PATENT DOCUMENTS

| | | | |
|---|---|---|---|
| 2016/0190154 A1 | 6/2016 | Nozawa | |
| 2017/0179028 A1* | 6/2017 | Lee | H01L 27/11575 |
| 2017/0194255 A1* | 7/2017 | Oh | H01L 21/76816 |
| 2018/0053686 A1* | 2/2018 | Hyun | H01L 27/11575 |
| 2019/0280001 A1 | 9/2019 | Terasawa et al. | |
| 2019/0363014 A1* | 11/2019 | Lee | H01L 27/11575 |
| 2020/0075628 A1* | 3/2020 | Nanami | H01L 29/40117 |
| 2020/0098788 A1* | 3/2020 | Oh | H01L 27/11575 |
| 2022/0148971 A1* | 5/2022 | Lamborn | H01L 23/5283 |

FOREIGN PATENT DOCUMENTS

| | | |
|---|---|---|
| CN | 108428703 A | 8/2018 |
| CN | 108493192 A | 9/2018 |
| CN | 109196644 A | 1/2019 |
| CN | 110323226 A | 10/2019 |
| TW | 201836029 A | 10/2018 |
| TW | 201913937 A | 4/2019 |

\* cited by examiner

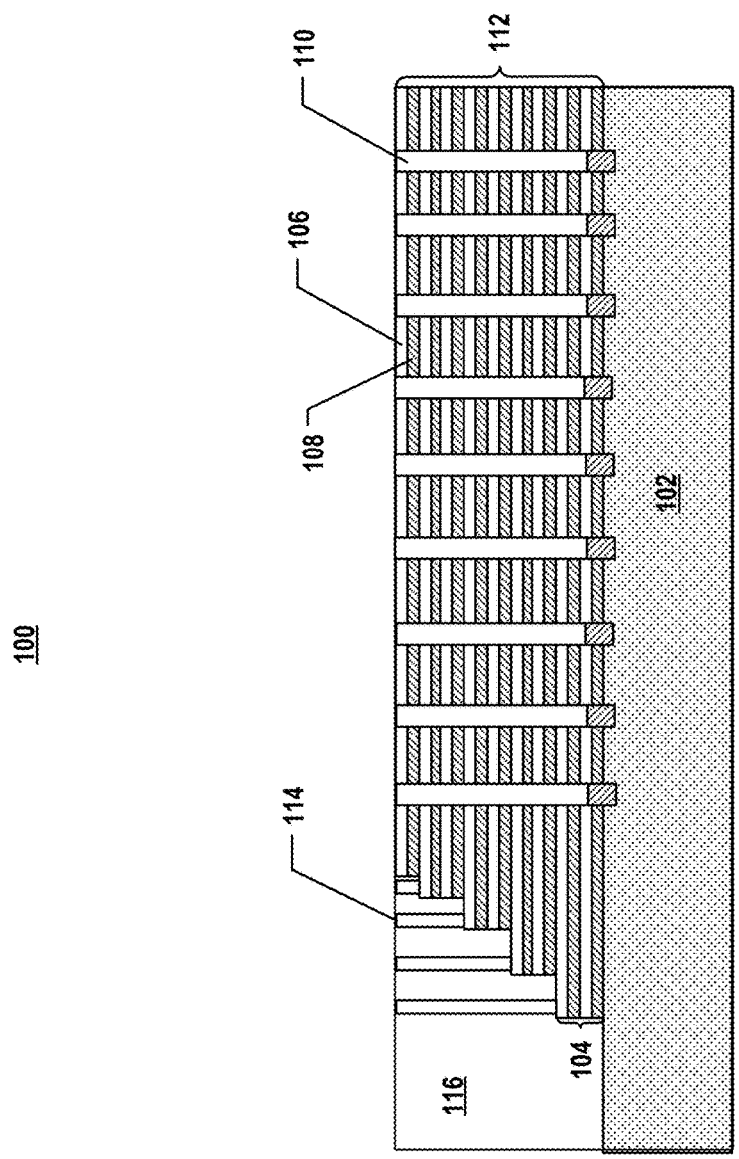
FIG. 1
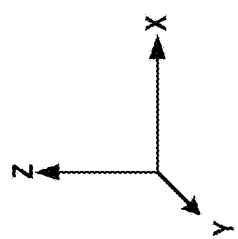

200

200

200

300

300

300

300

METHOD AND STRUCTURE FOR FORMING STAIRS IN THREE-DIMENSIONAL MEMORY DEVICES

CROSS-REFERENCE TO RELATED APPLICATIONS

This application is continuation of International Application No. PCT/CN2019/115668, filed on Nov. 5, 2019, entitled "METHOD AND STRUCTURE FOR FORMING STAIRS IN THREE-DIMENSIONAL MEMORY DEVICES," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and fabrication methods thereof are disclosed herein.

In one example, a 3D memory device includes a memory stack having a plurality of stairs. Each stair may include interleaved one or more conductor layers and one or more dielectric layers. Each of the stairs includes one of the conductor layers on a top surface of the stair, the one of the conductor layers having (i) a bottom portion in contact with one of the dielectric layers, and (ii) a top portion exposed by the memory stack and in contact with the bottom portion. A lateral dimension of the top portion may be less than a lateral dimension of the bottom portion. An end of the top portion that may be facing away from the memory stack laterally exceeds the bottom portion by a distance.

In another example, a 3D memory device includes a memory stack having a plurality of stairs. Each stair may include interleaved one or more conductor layers and one or more dielectric layers. Each of the stairs may include one of the conductor layers on a top surface of the stair. The one of the conductor layers may include (i) a bottom portion in contact with one of the dielectric layers, and (ii) a top portion exposed by the memory stack and in contact with the bottom portion. An end of the top portion that may be facing away from the memory stack laterally exceeds the bottom portion by a distance in a range of about 0.1 nm to about 20 nm.

In still another example, a method for forming a 3D memory device includes the following operations. First, a dielectric stack may be formed to have interleaved a plurality of sacrificial layers and a plurality of dielectric layers. A stair may be formed in the dielectric stack. The stair may include one or more sacrificial layers of the plurality of sacrificial layers and one or more dielectric layers of the plurality of dielectric layers. The stair may expose one of the sacrificial layers on a top surface and the one or more sacrificial layers on a side surface. An insulating portion may be formed to cover the side surface of the stair to cover the one or more sacrificial layers. A sacrificial portion may be formed to cover the top surface of the stair, the sacrificial portion being in contact with the one of sacrificial layers. The one or more sacrificial layers and the sacrificial portion may be replaced with one or more conductor layers.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 1 illustrates a schematic view of a 3D memory device having a plurality of stairs.

Figure 2A:
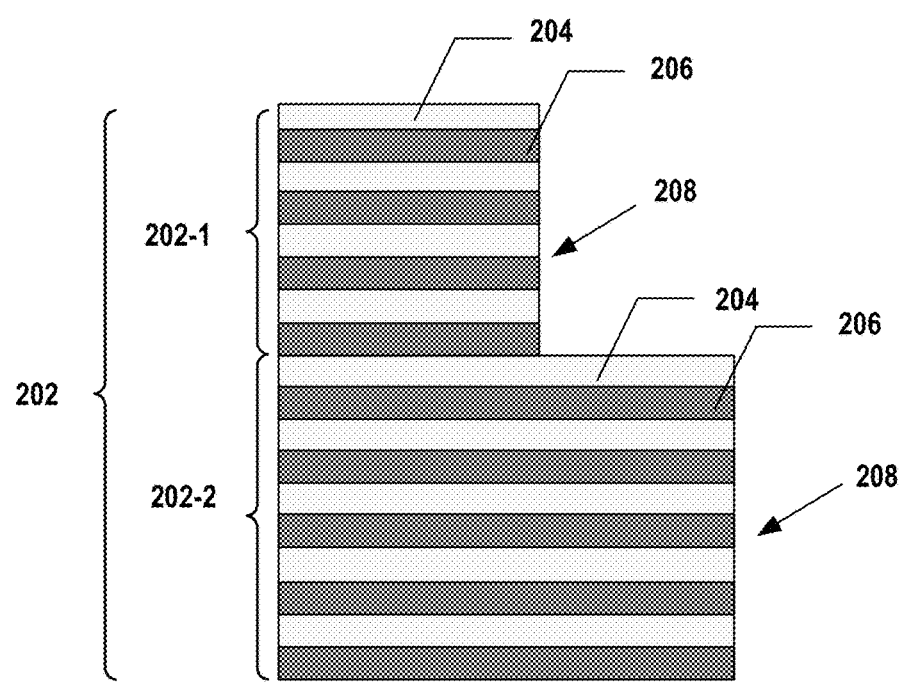
FIGS. 2A-2D illustrate a method for forming stairs in a 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "(3D memory string" refers to a vertically-oriented string of memory cell transistors connected in series on a laterally-oriented substrate so that the string of memory cell transistors extends in the vertical direction with respect to the substrate. As used herein, the term "vertical/vertically" means nominally perpendicular to the lateral surface of a substrate.

As used herein, the terms "stair," "step," and "level" can be used interchangeably. As used herein, a staircase structure refers to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stair" refers to a vertical shift in the height of a set of adjoined surfaces. A "staircase structure" refers a structure having a plurality of stairs extending vertically.

Staircase structures have been introduced into 3D memory devices as the demand for higher memory capacity continues to increase. A 3D memory device, in which memory cells are distributed vertically and laterally, can have a desired number of stairs/levels (e.g., 32, 64, and 96) along the vertical direction. Often, a 3D memory device can be formed by first forming a staircase structure having a plurality of stairs, each stair having one or more sacrificial/dielectric layers. The sacrificial layers are then replaced with conductor layers, on which contacts are formed to conductively connect the conductor layers to a peripheral circuit. As 3D memory devices continue to scale up vertically (e.g., having 96-levels or more), thinner sacrificial/dielectric layer pairs are used. The thinner sacrificial layers can result in thinner conductor layers.

It can be difficult for the thinner conductor layers to serve as the etch-stop layer in the formation of the contacts, which are often formed by patterning the insulating structure in which the staircase structure is positioned to form openings that extend in the insulating structure and expose the conductor layers. As a remedy, conductor layers in contact with the contacts are thickened. One way is to deposit a sacrificial film, e.g., silicon nitride film, using, e.g., atomic layered deposition (ALD), on the sacrificial layers, before they are replaced with conductor layers, to thicken the sacrificial layers. As a result of the ALD, the sacrificial film can also cover the side surfaces of the stairs, and an etch-back process is often performed to remove the excess portions of the sacrificial film on the side surfaces, preventing undesirable conductor portions to be formed on the side surfaces in the subsequent gate-replacement process and to cause a short circuit. However, the etch-back process sometimes also removes portions of the sacrificial layers exposed on the side surfaces, reducing the total area of the sacrificial layers. This can cause reduced total area of the conductor layers and increased resistance of the 3D memory device. The fabrication of the staircase structure thus needs to be improved.

Various embodiments in accordance with the present disclosure provide a 3D memory device having a memory stack. The memory stack includes a plurality of stairs, forming a staircase structure. Each stair has a conductor layer disposed on the top surface and in contact with a contact. The conductor layer on the top surface of the respective stair can have a sufficient thickness to function as an etch-stop layer for the formation of the contact, while the total area of other conductor layers in the stairs stay unchanged (e.g., not affected/reduced by the fabrication process). The resistance of the conductor layers may have little or no increase due to the thickening of the conductor layers on the top surfaces of the stairs.

Specifically, before the sacrificial layers being replaced with conductor layers, a stack structure with a plurality of stairs can be formed. Each stair may have a respective sacrificial layer disposed on the respective top surface. An insulating layer can be deposited (e.g., using ALD) and etched back to form insulating portions that cover the side surfaces of the stairs. The insulating portions can cover the conductor layers on the side surfaces of the stairs to prevent the conductor layers from being etched/damaged in the subsequent fabrication operations. The insulating layer can include any suitable insulating material(s) that can be formed from deposition, such as silicon oxide and/or high dielectric constant (high-k) dielectric materials. A sacrificial film can then be deposited and etched back to form portions that cover the top surfaces and be in contact with the exposed portions of the sacrificial layers. The sacrificial layers and the portions of the sacrificial film can then be replaced in the same process (e.g., gate-replacement process) with a plurality of conductor layers. The lengths/width of the sacrificial layers can be maintained. The conductor layers on the top surfaces of the stairs can thus each have a greater thickness to function as an etch-stop layer for the formation of the conductor layers.

In the 3D memory device according to the present disclosure, the conductor layer on the top surface of each stair may include a top portion and a bottom portion. The bottom portion may be in contact with an underneath dielectric layer, and the top portion may be above the bottom portion and in contact with the contact. The end of the top portion facing away from the memory stack may exceed the bottom portion by a distance, which is determined based on the thickness of the respective insulating portion covering the side surface. The insulating portion can be covered by the top portion. The distance (i.e., the thickness of the insulating portion) can be in a range of about 0.1 nm to about 20 nm. In some embodiments, the distance is between about 1 nm to about 10 nm.

FIG. 1 illustrates a 3D memory device 100 having a memory stack 112 above a substrate 102. Memory stack 112 may include interleaved a plurality of conductor layers 106 and a plurality dielectric layers 108, and a plurality of 3D memory strings 110 extending in memory stack 112 into substrate 102. 3D memory device 100 may also include an insulating structure 116 in which memory stack 112 is positioned and a plurality of contacts 114 extending in an insulating structure 116 and in contact with respective conductor layers 106. It is noted that x-, y-, and z-axes are added in FIGS. 1, 2A-2D, and 3A-3F to further illustrate the spatial relationship of the components in the structures/devices. For example, substrate 102 includes two lateral surfaces (e.g., a top surface and a bottom surface) extending laterally in the x- and y-axes (the lateral directions). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the z-axis (the vertical direction or thickness direction) when the substrate is positioned in the lowest plane of the semiconductor device in the y-axis. The same notion for describing the spatial relationship is applied throughout the present disclosure.

In some embodiments, substrate 102 includes silicon (e.g., single crystalline silicon, c-Si), silicon germanium (SiGe), gallium arsenide (GaAs), germanium (Ge), silicon on insulator (SOI), or any other suitable materials. In some embodiments, insulating structure 116 includes silicon oxide. In some embodiments, contacts 114 includes conductor materials including, but not limited to, W, Co, Cu, Al, doped silicon, silicides, or any combination thereof.

Memory stack 112 may include a plurality of stairs 104, forming a staircase structure. Memory stack 112 may include interleaved a plurality of conductor layers 106 and a plurality of dielectric layers 108 extending in the x- and y-axes, forming a plurality of conductor/dielectric pairs stacking along the z-axis/vertical direction. Interleaved conductor layers 106 and dielectric layers 108 in memory stack 112 can alternate along the vertical direction. In other words, except for the ones at the top or bottom of memory stack 112, each conductor layer 106 can be adjoined by two dielectric layers 108 on both sides, and each dielectric layer 108 can be adjoined by two conductor layers 106 on both sides. Conductor layers 106 can each have the same thickness or different thicknesses. Similarly, dielectric layers 108 can each have the same thickness or different thicknesses. Conductor layers 106 can include conductor materials including, but not limited to, W, Co, Cu, Al, doped silicon, silicides, or any combination thereof. Dielectric layers 108 can include dielectric materials including, but not limited to, silicon oxide, silicon nitride, silicon oxynitride, or any combination thereof.

The intersection of 3D memory strings 110 and conductor layers 106 can form an array of memory cells in memory stack 112. In some embodiments, each 3D memory string 110 is a "charge trap" type of NAND memory string including a semiconductor channel and a memory film. In some embodiments, the semiconductor channel includes silicon, such as amorphous silicon, polysilicon, or single crystalline silicon. In some embodiments, the memory film is a composite dielectric layer including a tunneling layer, a storage layer (also known as "charge trap/storage layer"), and a blocking layer. Each 3D memory string 110 can have a cylinder shape (e.g., a pillar shape). The semiconductor channel, the tunneling layer, the storage layer, and the blocking layer of memory film are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, the blocking layer can include a composite layer of silicon oxide/silicon oxynitride/silicon oxide (ONO). In another example, the blocking layer can include a high-k dielectric layer, such as aluminum oxide ($Al_2O_3$), hafnium oxide ($HfO_2$) or tantalum oxide ($Ta_2O_5$) layer, and so on.

In some embodiments, 3D memory strings 110 further include a plurality of control gates (each being part of a word line). Each conductor layer 106 in memory stack 112 can act as a control gate for each memory cell of 3D memory string 110. In some embodiments, each 3D memory string 110 includes two plugs at a respective end in the vertical direction. One plug, at the lower end of 3D memory string 110 and in contact with the semiconductor channel, can include a semiconductor material, such as single-crystal silicon, that is epitaxially grown from substrate 102. The plug can function as the channel controlled by a source select gate of 3D memory string 110. As used herein, the "upper end" of a component (e.g., 3D memory string 110) is the end farther away from substrate 102 in the z-axis, and the "lower end" of the component (e.g., 3D memory string 110) is the end closer to substrate 102 in the z-axis when substrate 102 is positioned in the lowest plane of 3D memory device 100. Another Plug can include semiconductor materials (e.g., polysilicon). By covering the upper end of 3D memory string 110 during the fabrication process, the other plug can function as an etch stop layer to prevent etching of dielectrics filled in 3D memory string 110, such as silicon oxide and silicon nitride. In some embodiments, the other plug functions as the drain of 3D memory string 110.

As shown in FIG. 1, each stair 104 may include one or more conductor/dielectric pairs stacking along the vertical direction. In some embodiments, each stair 104 includes conductor layer 106 disposed on the respective top surface to be in contact with the respective contact 114, which is conductively connected to a peripheral circuit (not shown) of memory stack 112.

Figure 2B:
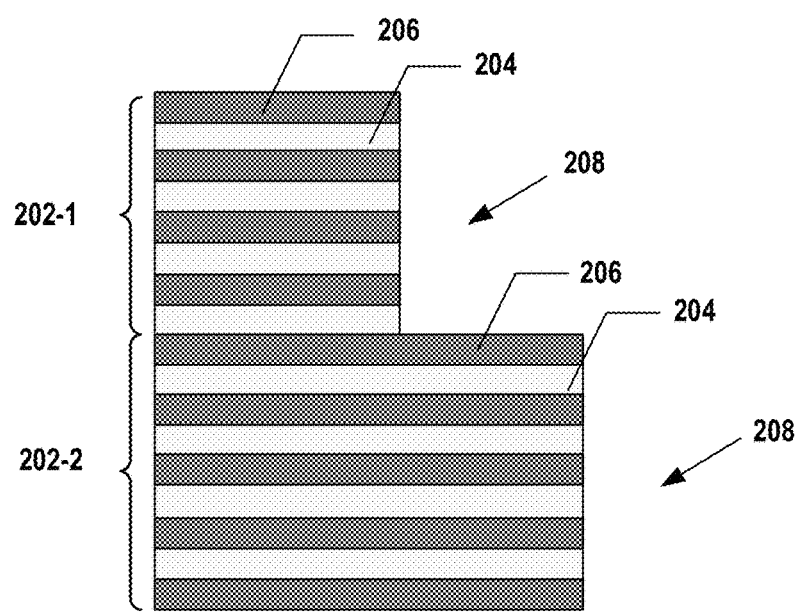
Figure 2B:
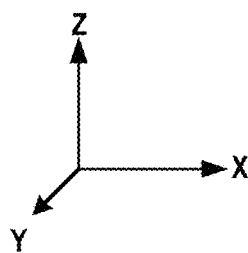
Figure 2C:
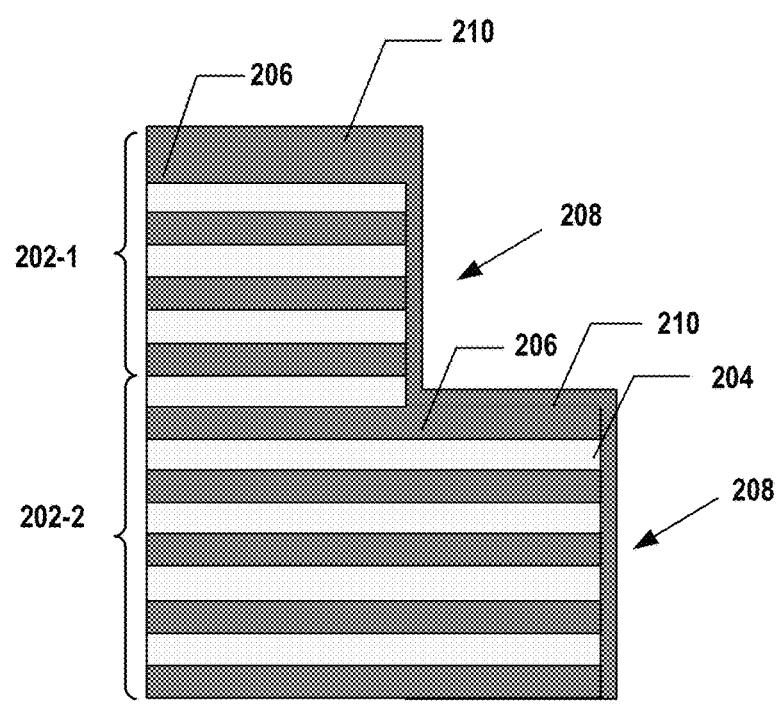
Figure 2C:
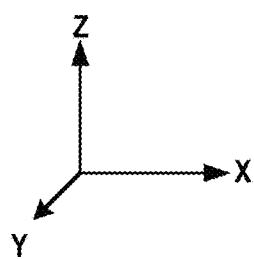
Figure 2D:
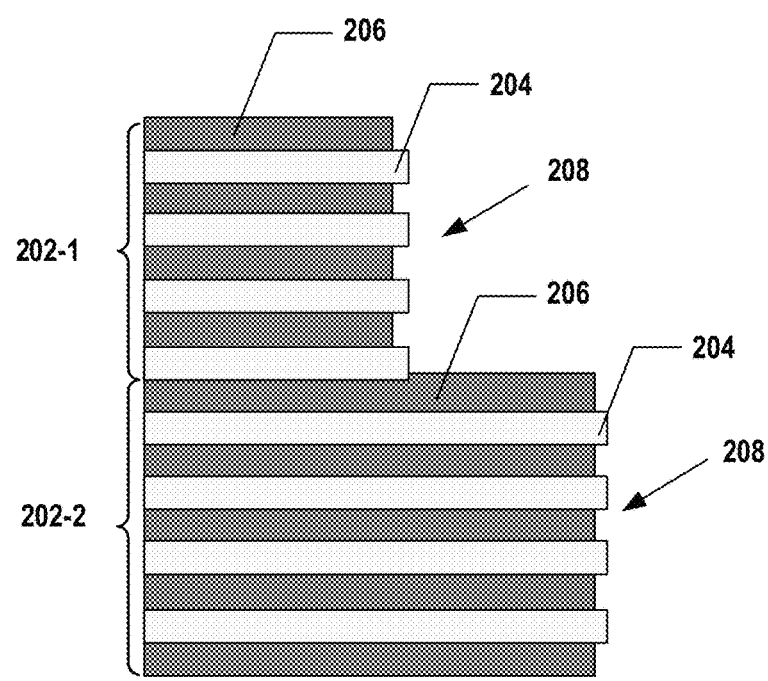
Figure 2D:
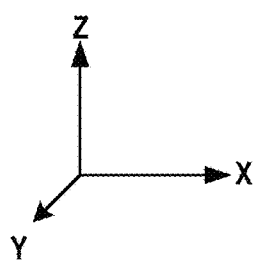

FIGS. 2A-2D illustrate a partial fabrication process 200 to form stairs in a staircase structure using existing operations. FIG. 2B is a continuation of FIG. 2A. FIG. 2C is a continuation of FIG. 2B. FIG. 2D is a continuation of FIG. 2C. Specifically, FIGS. 2A-2D illustrate the process to thicken the sacrificial layer on the top surface of each stair before the gate-replacement process. As shown in FIG. 2A, a staircase structure 202 having a plurality of stairs can be formed. For ease of illustration, the substrate is omitted from FIGS. 2A-2D, and two consecutive stairs 202-1 and 202-2 are shown to represent the stairs in staircase structure 202. Staircase structure 202 includes interleaved a plurality of dielectric layers 204 and a plurality of sacrificial layers 206, stacking along the vertical direction. Sacrificial layers 206 can include a suitable material different from the material(s) of dielectric layers 204 and can be replaced with conductor layers in the subsequent gate-replacement operation. For example, sacrificial layers 206 includes silicon nitride and dielectric layers 204 includes silicon oxide. Each of stairs 202-1 and 202-2 includes one or more pairs of sacrificial/dielectric pairs. Stairs 201-1 and 202-2 each includes a side surface 208 extending along the vertical direction and exposing sacrificial layers 206 in the respective stair.

As shown in FIGS. 2A and 2B, staircase structure 202 is etched vertically to expose sacrificial layer 206 on the top surface of each stair, e.g., 202-1 and 202-2. In FIG. 2C, a sacrificial film 210 is deposited to cover at least the top surfaces of the stairs, e.g., 202-2 and 202-2, and increase the total thickness of the sacrificial material on the top surface of each stair, e.g., a sum of the thickness of sacrificial layer 206 and the thickness of sacrificial film 210, to a desired value/range. Sacrificial film 210 can be formed by ALD and can include, e.g., silicon nitride. In FIG. 2C, to remove any portions of sacrificial film 210 on side surfaces 208 of the stairs, e.g., 202-1 and 202-2, a recess etch is performed. The recess etch can also remove a portion of the sacrificial material on the top surface of each stair, e.g., 202-1 and 202-2, such that the final thickness of the sacrificial material on the top surface is desirable for the gate-replacement process. The subsequently-formed conductor layers on the top surfaces of the stairs, e.g., 202-1 and 202-2, can also have sufficient thicknesses to function as an etch-stop layer for the subsequent formation of contacts.

However, as shown in FIG. 2D, the recess etch can undesirably remove a portion of each sacrificial layer 206 exposed on side surfaces 208 of the stairs, e.g., 202-1 and 202-2, in addition to the removal of the portions of sacrificial film 210 on side surfaces 208. Sacrificial layers 206 then have reduced lengths/widths along the x-axis, causing the conductor layers in the memory stack, formed by the gate-replacement process, to have reduced lengths/widths along the x-axis. The portion can be about 20 nm to about 50 nm, e.g., approximately 30 nm, along the x-axis. In subsequent operations, after sacrificial layers 206 are replaced with conductor layers, an insulating structure is formed to fill up the space formed by the removal of sacrificial layers 206, such that the lateral distance/space filled with the insulating structure, caused by the removal of the portions of sacrificial layers 206, is about 20 nm to about 50 nm, e.g., approximately 30 nm. The resistance of the conductor layers can be undesirably increased.

Embodiments of the present disclosure provide the structure and fabrication method of stairs in a 3D memory device, which includes a substrate, a memory stack having a staircase structure, a plurality of memory strings, and an insulating structure in which the memory stack is positioned. The overall structure of the 3D memory device may be similar to 3D memory device 100. The memory stack/staircase structure may include a plurality of stairs stacking along the z-axis, similar to stairs 104. However, the structure and fabrication method to form stairs in the present disclosure may be different from those of the existing technology and are described in detail in FIGS. 3A-3F. In the present disclosure, two consecutive stairs are illustrated to represent the fabrication and structures of a plurality of stairs, e.g., all stairs, in the 3D memory device. For simplicity of illustration, embodiments of the present disclosure emphasize on the formation of stairs, e.g., thickening the conductor layers in contact with the contacts without reducing the lengths/widths of the conductor layers, and other parts are omitted from the description of FIGS. 3A-3F.

Figure 3A:
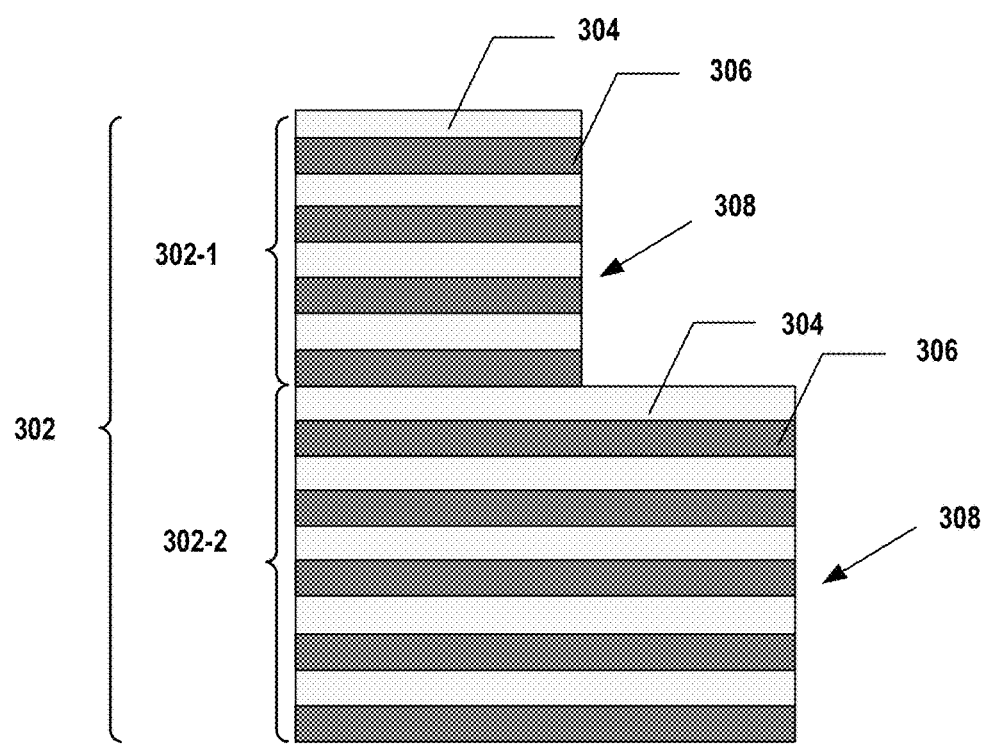
FIGS. 3A-3F illustrate an exemplary method for forming stairs in a 3D memory device, according to some embodiments.
Figure 3B:
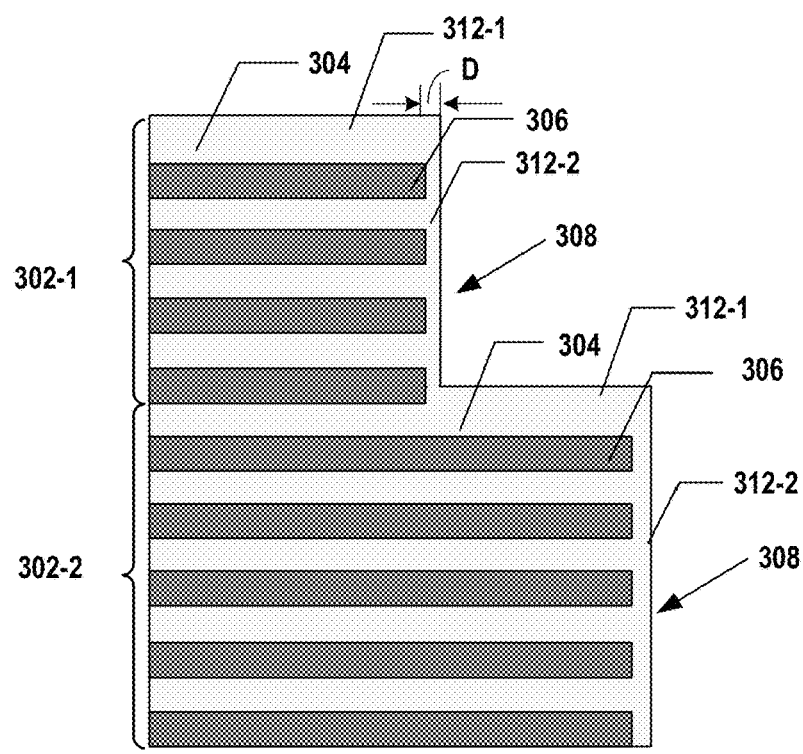
Figure 3C:
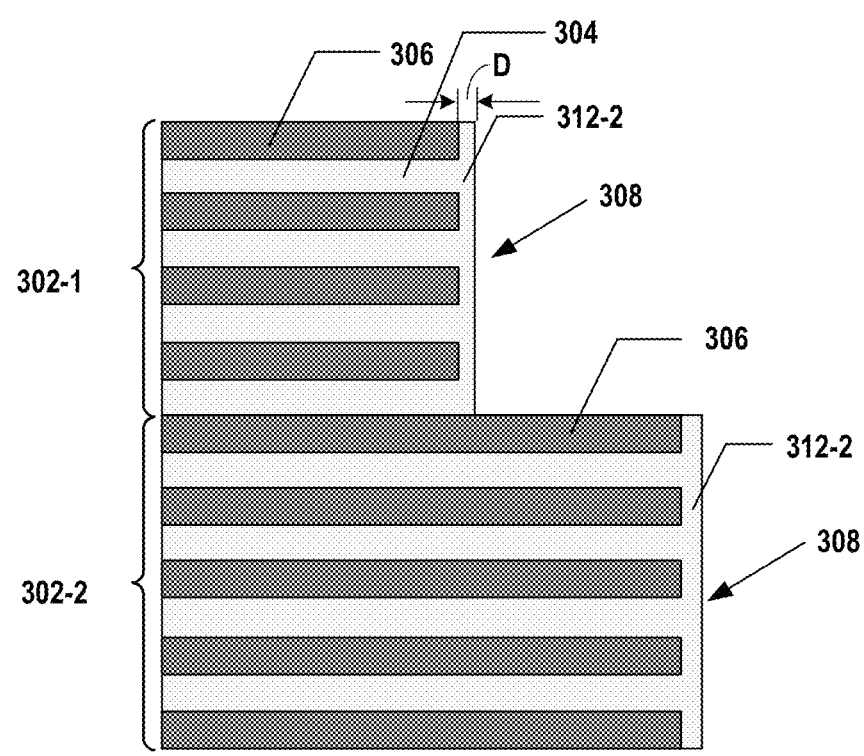
Figure 3C:
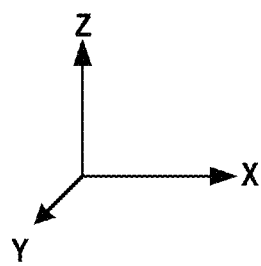
Figure 3D:
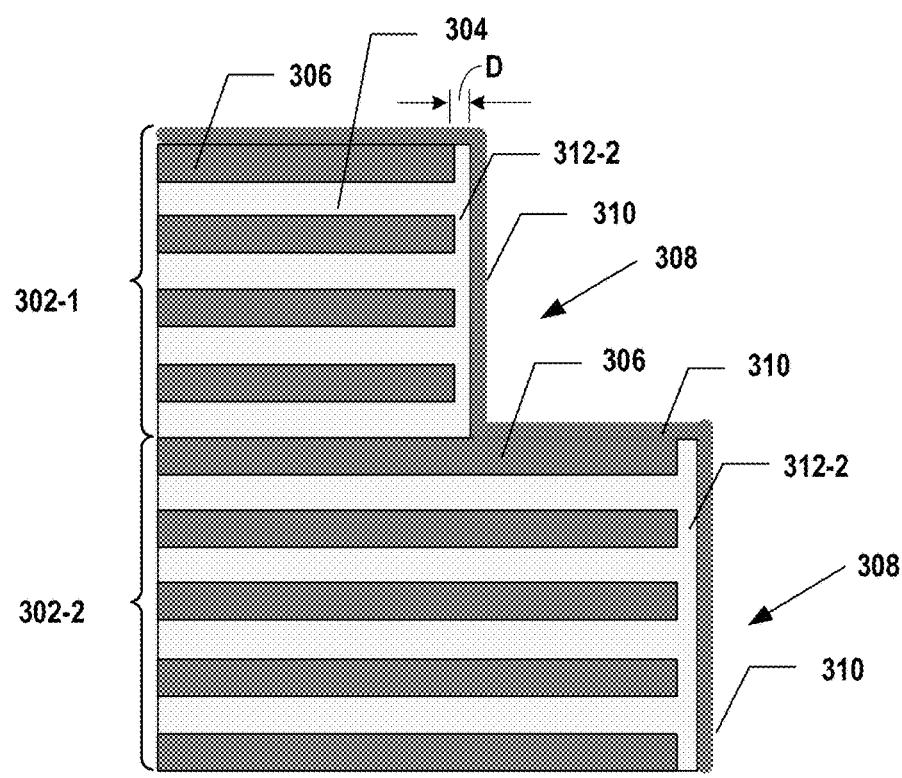
Figure 3E:
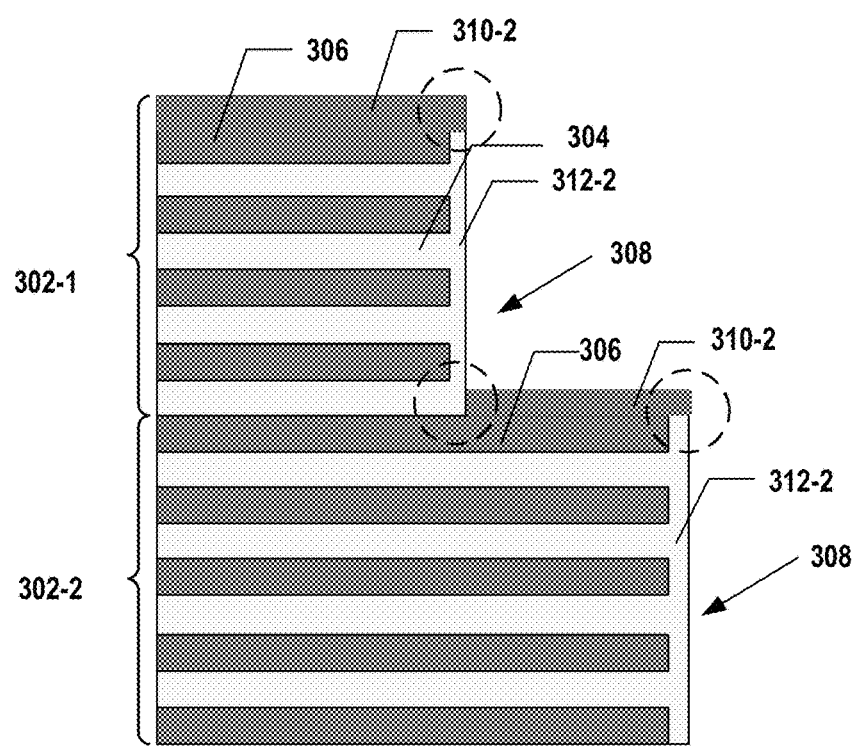
Figure 3E:
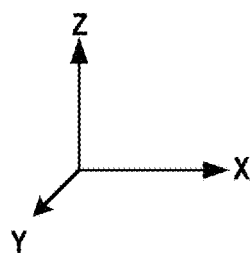
Figure 3F:
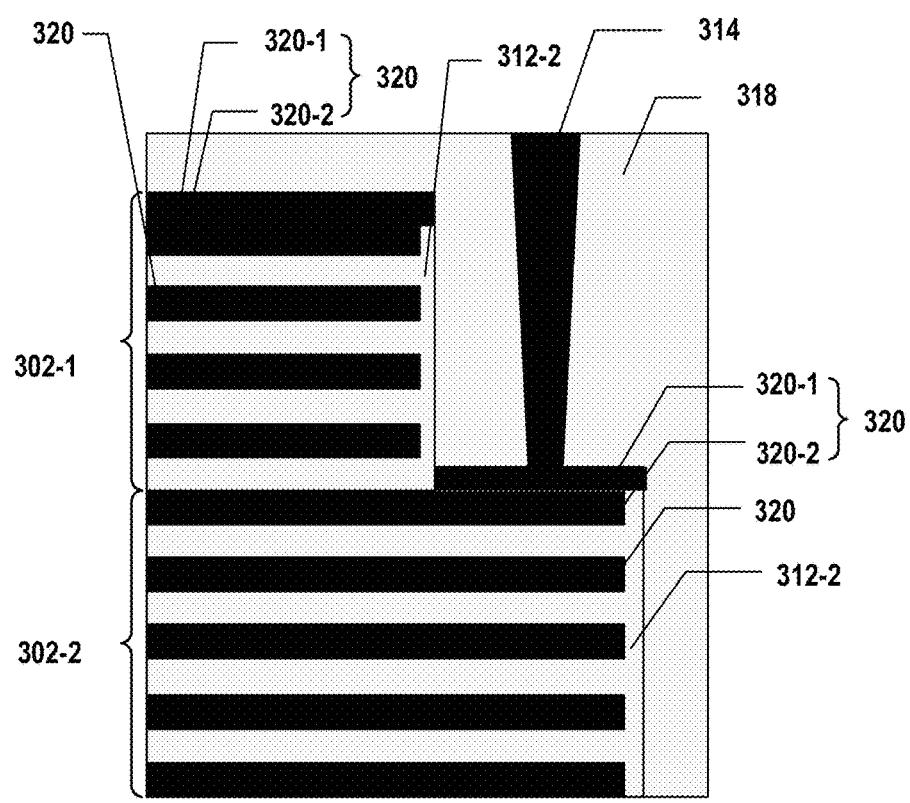
Figure 3F:
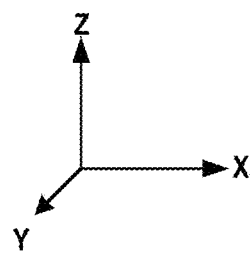
Figure 4:
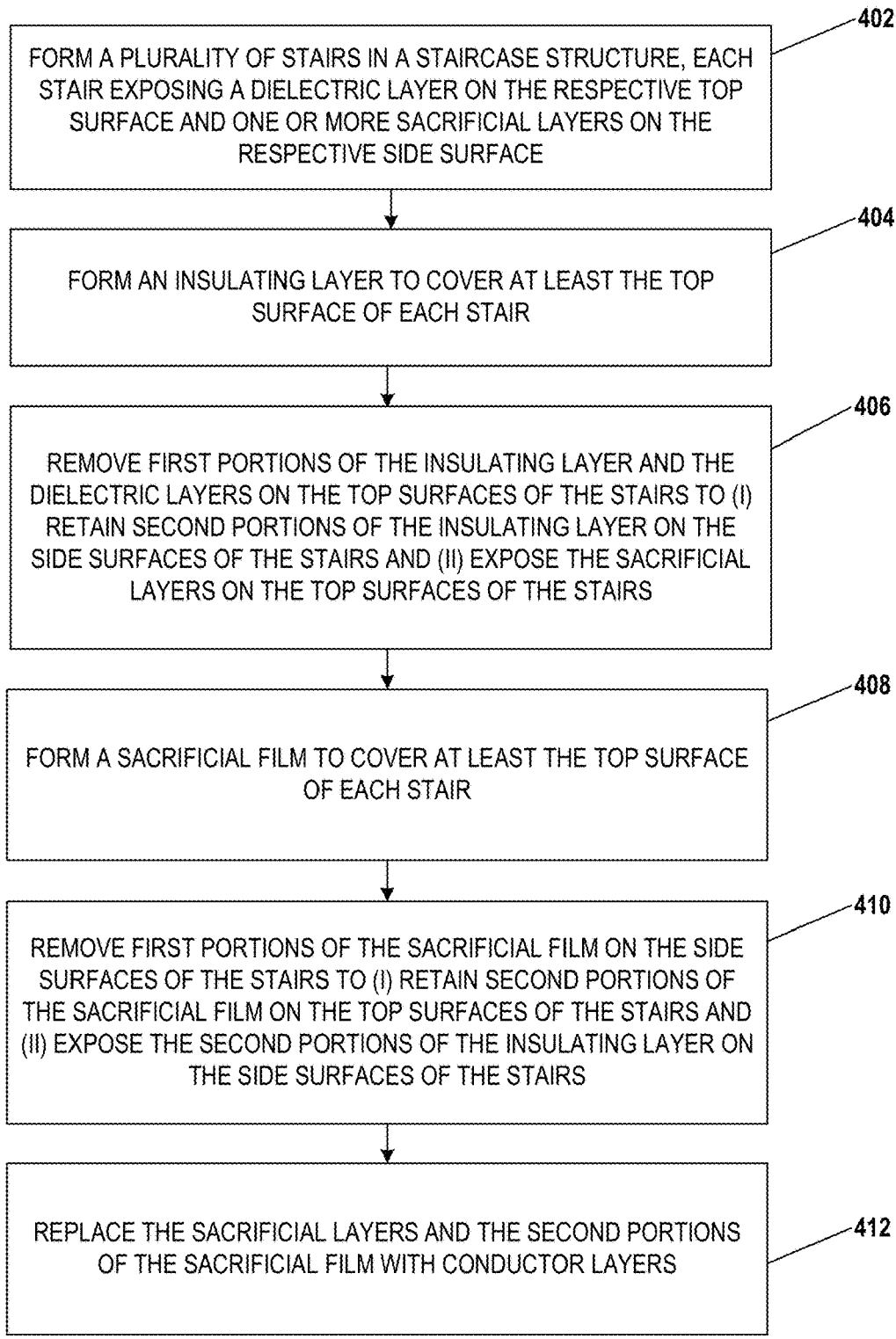
FIG. 4 illustrates a flowchart of an exemplary method for forming stairs in a 3D memory device, according to some embodiments.

FIGS. 3A-3F illustrate an exemplary fabrication method 300 to form a plurality of stairs in a memory stack, according to some embodiments. FIG. 3B is a continuation of FIG. 3A, and FIG. 3C is a continuation of FIG. 3B. FIG. 3D is a continuation of FIG. 3C, FIG. 3E is a continuation of FIG. 3D, and FIG. 3F is a continuation of FIG. 3E. In the memory stack, the lengths/widths of the conductor layers along the x-axis are maintained (or the lengths/width of the sacrificial layers are not affected by the fabrication process). FIG. 4 illustrates a flowchart 400 of method 300, according to some embodiments. It is understood that the operations shown in method 300 are not exhaustive and that other operations can be performed as well before, after, or between any of the illustrated operations. Further, some of the operations may be performed simultaneously, or in a different order than shown in FIGS. 3A-3F and 4.

Referring to FIG. 4, method 300 starts at operation 402, in which a stack structure having a plurality of stairs is formed, each stair exposing a dielectric layer on the respective top surface and one or more sacrificial layers on the respective side surface. FIG. 3A illustrates a corresponding structure.

As shown in FIG. 3A, a staircase structure 302 having a plurality of stairs, e.g., 302-1 and 302-2, may be formed on a substrate (not shown). Staircase structure 302 may include a plurality of dielectric layers 304 and a plurality of sacrificial layers 306 stacked alternatingly along the vertical direction. Each sacrificial layer 306 and an underlying dielectric layer 304 may form a sacrificial/dielectric pair. In some embodiments, each stair, e.g., 302-1 and 302-2, includes one or more sacrificial/dielectric pairs. That is, each stair may include one or more sacrificial layers 306 and one or more dielectric layers 304 arranged alternatingly along the vertical direction. In some embodiments, each stair includes more than one sacrificial/dielectric pair. Sacrificial layers 306 and dielectric layers 304 may include different materials and thus can be selectively etched, e.g., in the gate-replacement process.

Staircase structure 302 can be formed by repetitively etching a stack structure having a plurality of interleaved initial dielectric layers and initial sacrificial layers using an etch mask, e.g., a patterned PR layer over the respective stack structure. Each initial sacrificial layer and the underlying initial dielectric layer may be referred to as a dielectric pair. In some embodiments, one or more dielectric pairs can form one level/stair. During the formation of staircase structure 302, the PR layer is trimmed (e.g., etched incrementally and inwardly from the boundary of the material stack, often from all directions) and used as the etch mask for etching the exposed portion of the stack structure. The amount of trimmed PR can be directly related (e.g., determinant) to the dimensions of the stairs. The trimming of the PR layer can be obtained using a suitable etch, e.g., an isotropic etching process, such as wet etching. One or more PR layers can be formed and trimmed consecutively for the formation of staircase structure 302. Each dielectric pair can be etched, after the trimming of the PR layer, using suitable etchants to remove a portion of both the initial sacrificial layer and the underlying initial dielectric layer. The etched initial sacrificial layers and initial dielectric layers may respectively form sacrificial layers 306 and dielectric layers 304, which form stairs in the stack structure. The PR layer(s) can then be removed.

As shown in FIG. 3A, staircase structure 302 is etched to expose dielectric layer 304 on the top surface of each stair, e.g., 302-1 and 302-2. Each stair may include a side surface 308, which exposes one or more sacrificial layers 306 in the respective stair. In some embodiments, side surface 308 also exposes one or more dielectric layers 304, including dielectric layer 304 on the top surface of the respective stair.

Referring back to FIG. 4, after the formation of the staircase structure, method 300 proceeds to operation 404, in which an insulating layer is formed to cover at least the side surface of each stair. FIG. 3B illustrates a corresponding structure.

As shown in FIG. 3B, an insulating layer 312 may be formed to cover at least side surfaces 308 of stairs, e.g., 302-1 and 302-2, of staircase structure 302. Insulating layer 312 may cover at least the exposed sacrificial layers 306 on side surfaces 308 of the stairs, e.g., 302-1 and 302-2. In some embodiments, insulating layer 312 also covers, e.g., partially or fully, top surfaces of stairs, e.g., 302-1 and 302-2, and be in contact with dielectric layers 304 on the top surfaces. For ease of description, insulating layer 312 may include a plurality of first portions 312-1 each deposited on the top surface of the respective stair (e.g., 302-1/302-2), and a plurality of second portions 312-2 each deposited on the side surface of the respective stair (e.g., 302-1/302/2). Insulating layer 312 can be formed using a suitable deposition process such as ALD, and may include a dielectric material that can be formed using ALD. Insulating layer 312 can include the same material(s) as dielectric layers 304 or include different materials than dielectric layers 304. Insulating layer 312 can include materials the same as or different from the materials of dielectric layers 304. In some embodiments, insulating layer 312 includes a dielectric material different from the material(s) of sacrificial film 310, such that the etching of sacrificial film 310 can be blocked by insulating layer 312 to prevent the etch-back of sacrificial layer 306, which has the same material(s) as sacrificial film 310 (illustrated in subsequent steps). For example, the dielectric material of insulating layer 312 may have an etching selectivity that is sufficiently high compared with the material(s) of sacrificial film 310 to prevent the removal of insulating layer 312 while etching sacrificial film 310. In some embodiments, insulating layer 312 includes silicon oxide and/or a high-k dielectric material, such as aluminum oxide ($Al_2O_3$), hafnium oxide ($HfO_2$), and/or tantalum oxide ($Ta_2O_5$). In some embodiments, insulating layer 312 includes silicon oxide. Insulating layer 312 may be sufficiently thick to prevent sacrificial layers 306 from being etched in subsequent operations. In some embodiments, other suitable deposition methods such as chemical vapor deposition (CVD) and/or physical vapor deposition (PVD) are also used to form insulating layer 312.

Referring back to FIG. 4, after the formation of the insulating layer, method 300 proceeds to operation 406, in which the first portions of the insulating layer and the dielectric layers on the top surfaces of the stairs are removed to (i) retain the second portions of the insulating layer on the side surfaces of the stairs, and (ii) expose the sacrificial layers on the top surfaces of the stairs. FIG. 3C illustrates a corresponding structure.

As shown in FIG. 3C, first portions 312-1 of insulating layer 312 and dielectric layers 304 on the top surface of each stair, e.g., 302-1 and 302-2, can be removed. Second portions 312-2 of insulating layer 312 can be retained on side surfaces 308 of the stairs. Sacrificial layer 306 (e.g., underlying the respective dielectric layer 304 being removed) may be exposed on the top surface of each stair, e.g., 302-1 and 302-2. A thickness D of second portion 312-2 of insulation layer 312 along the x-axis, may be in a range of about 0.1 nm to about 20 nm, such as 0.1 nm to 20 nm. In some embodiments, the thickness of second portion 312-2 is in a range of about 1 nm to about 10 nm, such as 1 nm to 10 nm (e.g., 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, any range bounded by the lower end by any of these values, or in any range defined by any two of these values). In some embodiments, the thickness D of second portion 312-2 of insulation layer 312 is smaller than the thickness of part of sacrificial layers 206 that is etched back as shown in FIG. 2D. An anisotropic etching process, e.g., a dry etch, is employed to remove first portions 312-1 of insulating layer 312 and dielectric layers 304. Optionally, an isotropic etching process, e.g., wet etching, can be employed to trim the thickness of second portion 312-2 to be in a desired range.

Referring back to FIG. 4, after the removal of the second portions of the insulating layer and the dielectric layers, method 300 proceeds to operation 408, in which a sacrificial film is formed to cover at least the top surface of each stair. FIG. 3D illustrates a corresponding structure.

As shown in FIG. 3D, a sacrificial film 310 can be formed to cover at least the top surface of each stair, e.g., 302-1 and 302-2. Sacrificial film 310 may be in contact with sacrificial layers 306 on the top surfaces of the stairs, e.g., 302-1 and 302-2. In some embodiments, sacrificial film 310 also covers, e.g., partially or fully, side surfaces 308 of the stairs, e.g., 302-1 and 302-2. Sacrificial film 310 may include the same material as the material(s) of sacrificial layers 306, and may have a desirable thickness which allows a sufficiently-thick conductor layer to be subsequently formed on the top surface of each stair. In some embodiments, sacrificial film 310 is deposited using a suitable deposition process such as ALD. In some embodiments, other suitable deposition methods, such as CVD and/or PVD, are also used to form sacrificial film 310.

Referring back to FIG. 4, after the formation of the sacrificial film, method 300 proceeds to operation 410, in which, the first portions of the sacrificial film on the side surfaces of the stairs to (i) retain the second portions of the sacrificial film on the top surfaces of the stairs, and (ii) expose the second portions of the insulating layer on the side surfaces of the stairs. FIG. 3E illustrates a corresponding structure.

As shown in FIG. 3E, the first portions of sacrificial film 310 on side surfaces 308 of the stairs, e.g., 302-1 and 302-2, may be removed, and second portions 312-2 of insulating layer 312 can be exposed. An isotropic etching process, e.g., wet etch, can be performed to remove the first portions of sacrificial film 310. The remaining portions of sacrificial film 310 on the top surfaces of the stairs, e.g., 302-1 and 302-2, may form second portions 310-2 of sacrificial film 310. Each second portion 310-2 of sacrificial film 310 may be in contact with the respective sacrificial layer 306 on the top surface of the respective stair.

As shown in FIG. 3E, second portion 310-2 may be above and in contact with the respective sacrificial layer 306 on the top surface of each stair, e.g., 302-1 and 302-2. The end of second portion 310-2 facing away from staircase structure 302 may exceed sacrificial layer 306 along the x-axis by a distance determined by the thickness of second portion 312-2 of insulating layer 312. In some embodiments, the top surface of second portion 310-2 of sacrificial film 310 in one stair, e.g., 302-2, is higher than a bottom surface of the stair immediately above it, e.g., 302-1. In some embodiments, the bottom surface of a respective stair, e.g., 302-1 or 302-2, is the bottom surface of dielectric layer 304 at the bottom of the stair.

After second portions 310-2 of sacrificial film 310 are formed, method 300 proceeds to operation 412, in which the sacrificial layers and the second portions of the sacrificial film are replaced with a plurality of conductor layers. FIG. 3F illustrates a corresponding structure.

As shown in FIG. 3F, sacrificial layers 306 and second portions 310-2 of sacrificial film 310 may be replaced with a plurality of conductor layers 320 in a gate-replacement process. In each stair, e.g., 302-1 and 302-2, the conductor layer 320 on the top surface includes a top portion 320-1 and a bottom portion 320-2. Top portion 320-1 may be formed by the replacement of second portion 310-2 of the sacrificial film with a conductor material, and bottom portion 320-2 may be formed by the replacement of sacrificial layer 306 with the conductor material. Top portion 320-1 of conductor layer 320 may have a shape similar to that of the respective second portion 310-2 of sacrificial film 310. In some embodiments, the end of top portion 320-1 facing away from staircase structure 302 may exceed bottom portion 320-2 along the x-axis by the distance determined by the thickness of second portion 312-2 of insulating layer 312. Top portion 320-1 of conductor layer 320 may be exposed by staircase structure 302 (e.g., not covered by the stair immediately above the respective stair) and cover the respective second portion 312-2 of insulating layer 312, which may cover the side surface of the respective stair, e.g., cover bottom portion 320-2 of the conductor layers 320 on the top surface and any other conductor layers 320 in the respective stair. Conductor layers 320 may intersect with memory strings (structure and fabrication process omitted in FIG. 3) extending in staircase structure 302 and form an array of memory cells. Staircase structure 302 may form a memory stack.

In some embodiments, conductor layers 320 may be formed by removing second portions 310-2 of sacrificial film 310 and sacrificial layers 306 using an isotropic etching process, e.g., wet etch, to form a plurality of lateral recesses in staircase structure 302. The conductor material, e.g., W, Co, Al, Cu, doped silicon, and/or silides, may be deposited to fill up the lateral recesses, forming conductor layers 320. The conductor material can be deposited using any suitable deposition method such as CVD, PVD, ALD, or a combination thereof.

In some embodiments, after the formation of conductor layers 320, an insulating structure 318 is formed to surround staircase structure 302 such that staircase structure 302 is in insulating structure 318. Insulating structure 318 may be in contact with side surfaces 308 of the stairs (or second portions 312-2 of insulating layer 312) and top surfaces of the stairs. Insulating structure 318 may include any suitable insulating material(s) such as silicon oxide and can be formed by any suitable deposition process(es) such as CVD, PVD, and/or ALD. An opening, for forming a contact, may be formed to extend in insulating structure 318 and expose the top surface of a respective stair, e.g., 302-1 and 302-1. In some embodiments, the total thickness of top portion 320-1 and bottom portion 320-2 is sufficient to function as an etch-stop layer for the formation of the respective opening (e.g., for forming the respective contact). That is, a portion of top portion 320-1 of conductor layer 320 at the top surface of the respective stair can be exposed by the opening. A suitable conductive material, e.g., W, Co, Al, Cu, doped silicon, and/or silides, may be deposited to fill up the opening and form a contact 314. The conductive material can be deposited using any suitable deposition method such as CVD, PVD, ALD, or a combination thereof. Optionally, a planarization process, such as a chemical mechanical planarization and/or a wet etch, can be performed on the top surface of insulating structure 318 to remove any excess insulating material(s) and/or conductive material(s).

According to the embodiments of the present disclosure, a 3D memory device includes a memory stack having a plurality of stairs. Each stair may include interleaved one or more conductor layers and one or more dielectric layers. Each of the stairs includes one of the conductor layers on a top surface of the stair, the one of the conductor layers having (i) a bottom portion in contact with one of the dielectric layers, and (ii) a top portion exposed by the memory stack and in contact with the bottom portion. A lateral dimension of the top portion may be less than a lateral dimension of the bottom portion. An end of the top portion that may be facing away from the memory stack laterally exceeds the bottom portion by a distance.

In some embodiments, the 3D memory device further includes an insulating portion covered by the top portion and filling up the distance laterally. The insulating portion may (i) cover the bottom portion and the rest of the one or more conductor layers on the side surface of the stair, and (ii) be in contact with the top portion of another stair immediately below the respective stair.

In some embodiments, a top surface of the top portion is higher than the bottom surface of a third stair immediately above the respective stair.

In some embodiments, the distance is in a range of about 0.1 nm to about 20 nm.

In some embodiments, the distance is in a range of about 1 nm to about 10 nm.

In some embodiments, the insulating portion includes at least one of silicon oxide or a high-k dielectric.

In some embodiments, the 3D memory device further includes an insulating structure in which the memory stack is located, and a contact extending in the insulating structure and in contact with the top portion of the respective one of the conductor layers.

According to embodiments of the present disclosure, a 3D memory device includes a memory stack having a plurality of stairs. Each stair may include interleaved one or more conductor layers and one or more dielectric layers. Each of the stairs may include one of the conductor layers on a top surface of the stair. The one of the conductor layers may include (i) a bottom portion in contact with one of the dielectric layers, and (ii) a top portion exposed by the memory stack and in contact with the bottom portion. An end of the top portion that may be facing away from the memory stack laterally exceeds the bottom portion by a distance in a range of about 0.1 nm to about 20 nm.

In some embodiments, the distance is in a range of about 1 nm to about 10 nm.

In some embodiments, the 3D memory device further includes an insulating portion covered by the top portion and filling up the distance laterally. The insulating portion may (i) cover the bottom portion and the rest of the one or more conductor layers on the side surface of the stair, and (ii) be in contact with the top portion of another stair immediately below the respective stair.

In some embodiments, a lateral dimension of the top portion is less than a lateral dimension of the bottom portion.

In some embodiments, the insulating portion comprises at least one of silicon oxide or high-k dielectric.

In some embodiments, the 3D memory device further includes an insulating structure in which the memory stack is located, and a contact extending in the insulating structure and in contact with the top portion of the respective one of the conductor layers.

According to embodiments of the present disclosure, a method for forming a 3D memory device includes the following operations. First, a dielectric stack may be formed to have interleaved a plurality of sacrificial layers and a plurality of dielectric layers. A stair may be formed in the dielectric stack. The stair may include one or more sacrificial layers of the plurality of sacrificial layers and one or more dielectric layers of the plurality of dielectric layers. The stair may expose one of the sacrificial layers on a top surface and the one or more sacrificial layers on a side surface. An insulating portion may be formed to cover the side surface of the stair to cover the one or more sacrificial layers. A sacrificial portion may be formed to cover the top surface of the stair, the sacrificial portion being in contact with the one of sacrificial layers. The one or more sacrificial layers and the sacrificial portion may be replaced with one or more conductor layers.

In some embodiments, forming the insulating portion includes forming the stair to expose one of the dielectric layers on the top surface, forming an insulating layer to cover the top and side surfaces of the stair, and removing a portion of the insulating layer on the top surface of the stair and the one of the dielectric layers to expose the one of sacrificial layers. A remaining portion of the insulating layer on the side surface of the stair may form the insulating portion.

In some embodiments, forming the insulating layer includes performing an ALD.

In some embodiments, removing the portion of the insulating layer includes performing an anisotropic etching process.

In some embodiments, forming the insulating layer comprises depositing a layer of at least one of silicon oxide or high-k dielectric.

In some embodiments, forming the sacrificial portion includes forming a sacrificial film to cover at least the one of the sacrificial layers on the top surface of the stair, and removing a portion of the sacrificial film on the side surface of the stair to expose the insulating portion. A remaining portion of the sacrificial film on the top surface of the stair may form the sacrificial portion.

In some embodiments, forming the insulating layer includes depositing a layer of dielectric material that is different from a material of the sacrificial film.

In some embodiments, removing the portion of the sacrificial film includes performing an isotropic etching process.

In some embodiments, forming the sacrificial film includes depositing a film of sacrificial material that is the same as a material of the plurality of sacrificial layers.

In some embodiments, replacing the one or more sacrificial layers and the sacrificial portion with one or more conductor layers includes removing the one or more sacrificial layers and the sacrificial portion to form one or more lateral recesses, and depositing a conductor material to fill in the lateral recesses and form the one or more conductor layers.

In some embodiments, the method further includes forming an insulating structure surrounding the dielectric stack such that the dielectric stack is in the insulating structure, and forming a contact extending in the insulating stack and in contact with a conductor layer on the top surface of the stair.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising a memory stack comprising a plurality of stairs each comprising interleaved one or more conductor layers and one or more dielectric layers, wherein:

each of the stairs comprises a top conductor layer on a top surface of the stair and at least one conductor layer below the top conductor layer, the top conductor layer comprising (i) a bottom portion in contact with one of the dielectric layers, and (ii) a top portion in contact with the bottom portion and having a flat bottom surface, the bottom portion and the top portion comprise a same metal;

a lateral dimension of the top portion is less than a lateral dimension of the bottom portion;

the flat bottom surface of the top portion laterally exceeds the bottom portion and the at least one conductor layer by a distance; and side surfaces of the interleaved one or more conductor layers and one or more dielectric layers, except a side surface of the top portion of the top conductor layer, are fully and continuously covered by an insulating portion, wherein the insulating portion is (i) covered by the top portion, (ii) filling up the distance laterally, and (iii) in contact with a top portion of another stair immediately below the stair.

2. The 3D memory device of claim 1, wherein a top surface of the top portion is higher than the bottom surface of a third stair immediately above the respective stair.

3. The 3D memory device of claim 1, wherein the distance is in a range of about 0.1 nm to about 20 nm.

4. The 3D memory device of claim 3, wherein the distance is in a range of about 1 nm to about 10 nm.

5. The 3D memory device of claim 1, wherein the insulating portion comprises at least one of silicon oxide or a high dielectric constant (high-k) dielectric.

6. The 3D memory device of claim 1, wherein the plurality of stairs are surrounded by an insulating structure.

7. A three-dimensional (3D) memory device, comprising a memory stack comprising a plurality of stairs each comprising interleaved a plurality of conductor layers and a plurality of dielectric layers forming a plurality of conductor/dielectric pairs, wherein:

each of the stairs comprises a top conductor layer on a top surface of the stair and at least one conductor/dielectric layer pair below the top conductor layer, the top conductor layer comprising (i) a bottom portion in contact with one of the dielectric layers, and (ii) a top portion in contact with the bottom portion and having a flat bottom surface;

the flat bottom surface of the top portion laterally exceeds the bottom portion and the at least one conductor/dielectric layer pair by a distance in a range of about 0.1 nm to about 20 nm; and side surfaces of the plurality of conductor/dielectric pairs of each stair, except a side surface of the top portion of the top conductor layer, are fully and continuously covered by an insulating portion, wherein the insulating portion is (i) covered by the top portion, (ii) filling up the distance laterally, and (iii) in contact with a top portion of another stair immediately below the stair.

8. The 3D memory device of claim 7, wherein the distance is in a range of about 1 nm to about 10 nm.

9. The 3D memory device of claim 7, wherein a lateral dimension of the top portion is less than a lateral dimension of the bottom portion.

10. The 3D memory device of claim 7, wherein the insulating portion comprises at least one of silicon oxide or a high dielectric constant (high-k) dielectric.

11. The 3D memory device of claim 7, wherein the memory stack is surrounded by an insulating structure.

12. A three-dimensional (3D) memory device, comprising a memory stack comprising a plurality of stairs each comprising interleaved a plurality of conductor layers and a plurality of dielectric layers, wherein:

each of the stairs comprises a top conductor layer on a top surface of the stair, the top conductor layer comprising (i) a bottom portion in contact with one of the dielectric layers, and (ii) a top portion in contact with the bottom portion and having a flat bottom surface;

each of the stairs comprises an insulating portion in contact with a side surface of the stair, the flat bottom surface of the top portion, more than one conductor layer, and more than one dielectric layer below the top conductor layer in the stair, wherein the insulating portion comprising a high dielectric constant (high-k) dielectric material;

a lateral dimension of the top portion is less than a lateral dimension of the bottom portion;

an end of the top portion that is facing away from the memory stack laterally exceeds the bottom portion by a distance; and side surfaces of the plurality of stairs, except a side surface of the top portion of the top conductor layer, are fully and continuously covered by an insulating portion, wherein the insulating portion is (i) covered by the top portion, (ii) filling up the distance laterally, and (iii) in contact with a top portion of another stair immediately below the stair.

13. The 3D memory device of claim 12, wherein the distance is in a range of about 1 nm to about 10 nm.

14. The 3D memory device of claim 12, wherein the insulating portion is in contact with a top portion of another stair immediately below the respective stair.

15. The 3D memory device of claim 12, wherein a lateral dimension of the top portion is less than a lateral dimension of the bottom portion.

16. The 3D memory device of claim 12, wherein a top surface of the top portion is higher than the bottom surface of another stair immediately above the respective stair.

* * * * *